United States Patent
Liao et al.

(10) Patent No.: US 9,260,298 B1
(45) Date of Patent: Feb. 16, 2016

(54) STACKED MEMS MICROPHONE PACKAGING METHOD

(71) Applicant: LINGSEN PRECISION INDUSTRIES, LTD., Taichung (TW)

(72) Inventors: Hsien-Ken Liao, Taichung (TW); Ming-Te Tu, Taichung (TW)

(73) Assignee: LINGSEN PRECISION INDUSTRIES, LTD., Taichung (TW)

( * ) Notice: Subject to any disclaimer, the term of this patent is extended or adjusted under 35 U.S.C. 154(b) by 0 days.

(21) Appl. No.: 14/531,256

(22) Filed: Nov. 3, 2014

(30) Foreign Application Priority Data

Aug. 19, 2014 (TW) .............................. 103128418 A

(51) Int. Cl.
*H01L 27/04* (2006.01)
*B81C 1/00* (2006.01)
*H04R 31/00* (2006.01)

(52) U.S. Cl.
CPC .............. *B81C 1/0023* (2013.01); *H04R 31/00* (2013.01); *B81B 2201/0257* (2013.01); *B81C 2203/0127* (2013.01); *B81C 2203/0154* (2013.01); *B81C 2203/0792* (2013.01)

(58) Field of Classification Search
CPC .......................... H01L 2924/1461; H04R 3/00
See application file for complete search history.

(56) References Cited

U.S. PATENT DOCUMENTS

| | | | |
|---|---|---|---|
| 7,615,416 B1 * | 11/2009 | Chock ........................... | 438/127 |
| 8,030,722 B1 * | 10/2011 | Bolognia et al. ...... | B81B 7/0061 |
| | | | 257/433 |
| 8,115,283 B1 | 2/2012 | Bolognia et al. | |
| 9,029,962 B1 * | 5/2015 | Dreiza et al. ............ | H01L 27/04 |
| | | | 257/416 |
| 2004/0262729 A1 * | 12/2004 | Kumamoto ................... | 257/678 |
| 2007/0013036 A1 * | 1/2007 | Zhe et al. ..................... | 257/659 |
| 2011/0140283 A1 * | 6/2011 | Chandra et al. ............... | 257/777 |
| 2013/0106868 A1 * | 5/2013 | Shenoy ........................ | 345/501 |
| 2015/0091108 A1 * | 4/2015 | Huang et al. ................. | 257/417 |
| 2015/0117681 A1 * | 4/2015 | Watson et al. ................ | 381/174 |

* cited by examiner

*Primary Examiner* — Steven Loke
*Assistant Examiner* — Samuel Park
(74) *Attorney, Agent, or Firm* — Muncy, Geissler, Olds & Lowe PC

(57) ABSTRACT

A stacked MEMS microphone packaging method includes the steps of: providing a substrate having a conducting part and a through hole; affixing a retaining wall to the substrate and forming a conducting circuit in electrical connection with the conducting part; mounting a processor chip and a sensor chip on the substrate to have the sensor chip be disposed at a top side of the through hole; providing a carrier board having a first solder pad and a second solder pad and fixedly mounting the carrier board at the retaining wall and electrically coupled to the first solder pad and the second solder pad. Thus, the method can make a flip architecture MEMS microphone, reducing the steps of the packaging process and lowering the degree of difficulty of the manufacturing process and the manufacturing costs.

17 Claims, 4 Drawing Sheets

STACKED MEMS MICROPHONE PACKAGING METHOD

BACKGROUND OF THE INVENTION

1. Field of the Invention

The present invention relates to semiconductor packaging technology and more particularly, to a stacked MEMS (micro-electromechanical system) microphone packaging method.

2. Description of the Related Art

For the advantages of excellent electrical properties and smaller size, MEMS (Micro-electromechanical Systems) microphones have been getting more and more attention in the field of electro-acoustic. When compared with conventional electrets condenser microphones, MEMS microphones have the advantages of high electrical stability, consistent quality, small package size and ease of the use of SMT (Surface Mount Technology), etc. Therefore, the application of MEMS microphones in the field of acoustics will be more and more widespread.

The commonly known stacked MEMS microphone packaging method is to affix MEMS (Micro-electromechanical Systems) and ASIC (Application-specific Integrated Circuit) to a substrate using a die bonding process, and then to achieve conduction between MEMS/ASIC and an external signal using a wire bonding process, and then to mount a metal shell on the outside for shielding electromagnetic interference. This Stacked MEMS microphone packaging method needs to make a through hole on the metal shell or substrate for the transfer of acoustic signals to MEMS. For example, U.S. Pat. No. 8,115,283 discloses a semiconductor device, entitled "Reversible top/bottom MEMS package", which has a base substrate having a plurality Of metal traces and a plurality of base vias. An opening is formed through the base substrate. At least one die is attached to the first surface of the substrate and positioned over the opening. A cover substrate has a plurality of metal traces. A cavity in the cover substrate forms side wall sections around the cavity. The cover substrate is attached to the base substrate so the at least one die is positioned in the interior of the cavity. Ground planes in the base substrate are coupled to ground planes in the cover substrate to form an RF shield around the at least one die. The present invention provides a relatively simple method to reduce the degree of difficulty of the manufacturing process and the manufacturing costs.

SUMMARY OF THE INVENTION

The present invention has been accomplished under the circumstances in view. It is the main object of the present invention to provide a stacked MEMS microphone packaging method, which can not only produce a flip architecture MEMS microphone using a lamination technique but also significantly reduce the steps of the packaging process to reduce the degree of difficulty of the manufacturing process and the manufacturing costs.

To achieve this and other objects of the present invention, a stacked MEMS microphone packaging method of the invention comprises the steps of: A) providing a substrate comprising a conducting part and a through hole; B) providing a retaining wall comprising a conducting circuit and fixedly mounting the retaining wall at the substrate to have the conducting circuit be electrically coupled to the conducting part; C) mounting a processor chip on the substrate and electrically connecting the processor chip to the conducting part; D) mounting a sensor chip on the substrate over the through hole and adjacent to the processor chip and electrically connecting the sensor chip to the processor chip; and E) providing a carrier board having a first solder pad and a second solder pad and fixedly mounting the carrier board at the retaining wall to cover the processor chip and the sensor chip and to have the conducting circuit be disposed between the conducting part and one of the first solder pad and second solder pad and electrically coupled to the conducting part, the first solder pad and the second solder pad.

The stacked MEMS microphone packaging method further comprises a step of forming a connection part on the carrier board and electrically coupling the connection part to the conducting circuit, the first soldering point and the second solder pad.

Further, the retaining wall extends around the border of the carrier board to form therein an accommodation chamber for accommodating the processor chip and the sensor chip.

The stacked MEMS microphone packaging method further comprises a step of forming a first conductive layer on the side of the substrate that is connected with the retaining wall.

The stacked MEMS microphone packaging method further comprises a step of forming a second conductive layer on the retaining wall at the side that is connected with the substrate.

The stacked MEMS microphone packaging method further comprises a step of forming a third conductive layer on the carrier board at the side that is connected with the retaining wall.

Preferably, the aforesaid conductive layers are formed using the screen-printing or plate-printing.

The stacked MEMS microphone packaging method further comprises a compression heating process to cure the conductive layers, enabling the carrier board and retaining wall and the retaining wall and substrate be respectively fixedly bonded together.

Further, the conducting part comprises a first contact, a second contact, a third contact and a fourth contact respectively connected to one another. The conducting circuit comprises a first lead wire, a second lead wire and a third lead wire. The connection part comprises a first leading point, a second leading point and a third leading point. The processor chip is electrically connected to the first contact. The first lead wire has two opposite ends thereof respectively electrically connected to the second contact and the first leading point. The second lead wire has two opposite ends thereof respectively electrically connected to the third contact and the second leading point. The third lead wire has two opposite ends thereof respectively electrically connected to the fourth contact and the third leading point. The first leading point is electrically connected to the first solder pad. The second leading point and the third leading point are respectively electrically connected to the second solder pad.

The stacked MEMS microphone packaging method further comprises a wire bonding process to electrically connect the processor chip and the first contact.

The stacked MEMS microphone packaging method further comprises a wire bonding process to electrically connect the sensor chip and the processor chip.

The stacked MEMS microphone packaging method further comprises a step of forming an adhesive layer on the substrate, and then mounting the processor chip on the adhesive layer, and then employing a baking process to cure the adhesive layer and to further have the processor chip be fixedly bonded to the substrate.

The stacked MEMS microphone packaging method further comprises a step of forming an adhesive layer on the substrate, and then mounting the sensor chip on the adhesive layer, and then employing a baking process to cure the adhesive layer and to further have the sensor chip be fixedly bonded to the substrate.

The stacked MEMS microphone packaging method further comprises a step of forming an adhesive layer on the substrate, and then mounting the processor chip and the sensor chip on the adhesive layer, and then employing a baking process to cure the adhesive layer and to further have the processor chip and the sensor chip be fixedly bonded to the substrate.

The stacked MEMS microphone packaging method further comprises a step of forming an encapsulant on one side of the processor chip opposite to the substrate, and then employing a baking process to cure the encapsulant.

Further, the sensor chip is a micro-electromechanical system.

Further, the processor chip is an application-specific Integrated circuit.

Further, the carrier board, the retaining wall and the substrate can be bonded together using an automatic lamination press.

Alternatively, the carrier board, the retaining wall and the substrate can be bonded together using manual lamination tool.

Thus, the stacked MEMS microphone packaging method of the invention can make a flip architecture MEMS microphone with a lamination technique to significantly reduce the steps of the packaging process, thereby reducing the degree of difficulty of the manufacturing process and the manufacturing costs.

Other advantages and features of the present invention will be fully understood by reference to the following specification in junction with the accompanying drawings, in which like reference signs denote like components of structure.

DETAILED DESCRIPTION OF THE INVENTION

Referring to FIGS. 1A through 1E, a method for packaging a stacked MEMS (micro-electromechanical system) microphone 10 in accordance with the present invention is shown. The stacked MEMS microphone packaging method comprises the steps of A, B, C, D and E.

Figure 1A:
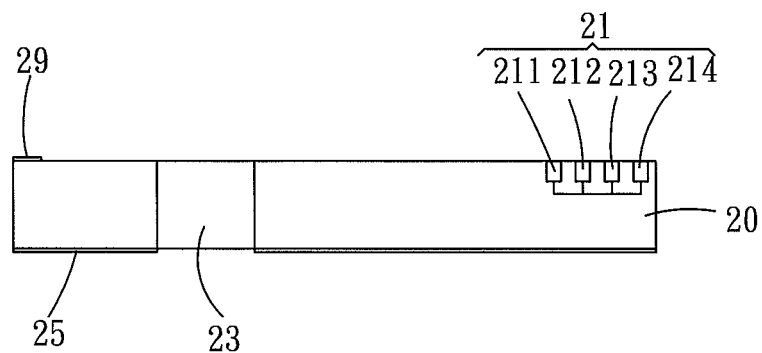
FIGS. 1A through 1I illustrate a manufacturing flow of a stacked MEMS microphone packaging method in accordance with the present invention

Step A: As illustrated in FIG. 1A, provide a substrate 20 comprising a conducting part 21 and a through hole 23, wherein the conducting part 21 comprises a first contact 211, a second contact 212, a third contact 213 and a fourth contact 214 respectively kept in conduction with one another.

Figure 1B:
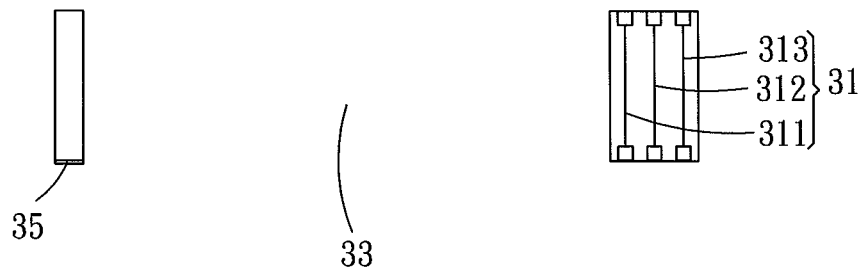
Figure 1C:
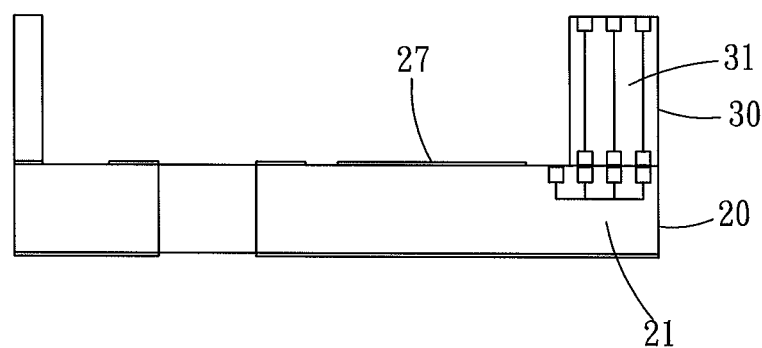
Figure 1D:
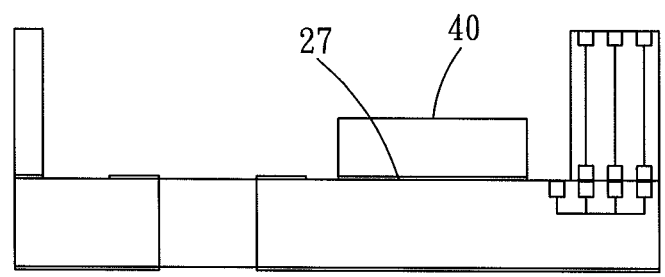
Figure 1E:
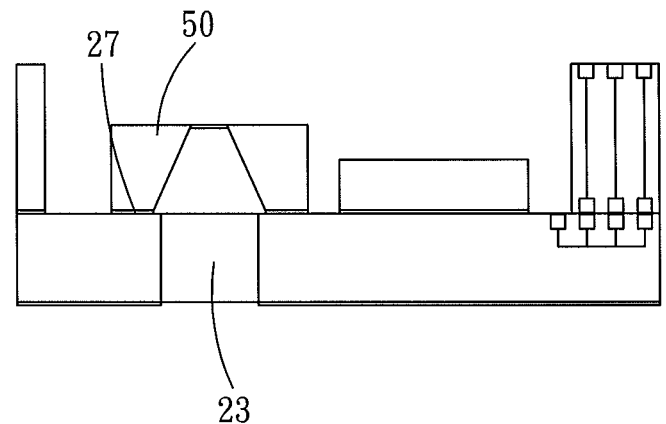
Figure 1F:
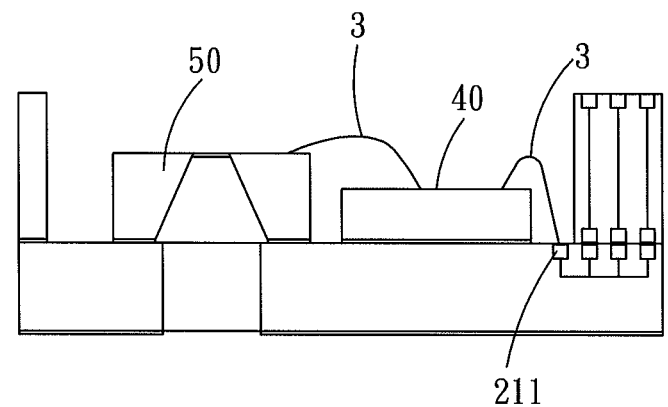

Step B: As illustrated in FIGS. 1B through 1C, provide a retaining wall 30 comprising a conducting circuit 31 and then fixedly mount the retaining wall 30 at the substrate 20 around the border of the substrate 20 to form an accommodation chamber 33 therein, wherein the conducting circuit 31 comprises a first lead wire 311, a second lead wire 312 and a third lead wire 313 respectively electrically connected with respective one ends thereof to the second contact 212, third contact 213 and fourth contact 214 of the conducting part 21.

Step C: As illustrated in FIGS. 1B through 1F, mount a processor chip 40 on the substrate 20 and electrically connect the processor chip 40 to the conducting part 21, and then mount a sensor chip 50 on the substrate 20 and electrically connect the sensor chip 50 to the processor chip 40 to have the processor chip 40 and the sensor chip 50 be accommodated in the accommodation chamber 33 within the retaining wall 30. Further, in order to let an external acoustic signal be directly transmitted to the sensor chip 50, the sensor chip 50 is disposed above the through hole 23 and adjacent to the processor chip 40. Thus, an external acoustic signal can be transmitted through the through hole 23 of the substrate 20 and then directly received by the sensor chip 50. In this embodiment, the above-mentioned electrical connection is done by means of a wire solder 3 using a wire bonding process. For example, the connection between the processor chip 40 and the first contact 211 is done using a wire bonding process; the connection between the sensor chip 50 and the processor chip 40 is done using a wire bonding process. Further, the sensor chip 50 is a micro-electromechanical system adapted for receiving an external acoustic signal and converting it into an electrical signal. The processor chip 40 is an application-specific integrated circuit designed and fabricated to meet the requirements of specific users and specific electronic systems, having the characteristics of small size, light weight, low power consumption, high reliability, enhanced privacy and low costs. Therefore, a microphone made using MEMS technology is also called as microphone chip or silicon microphone. The pressure sensitive film (not shown) in the micro-electromagnetic system is directly etched on the silicon chip using MEMS technology. The ASIC (application-specific integrated circuit) chip is normally integrated into a related circuit, such as pre-amplifier or analog-digital converter to form a digital microphone for outputting a digital signal directly to facilitate connection with modern digital circuits.

Figure 1G:
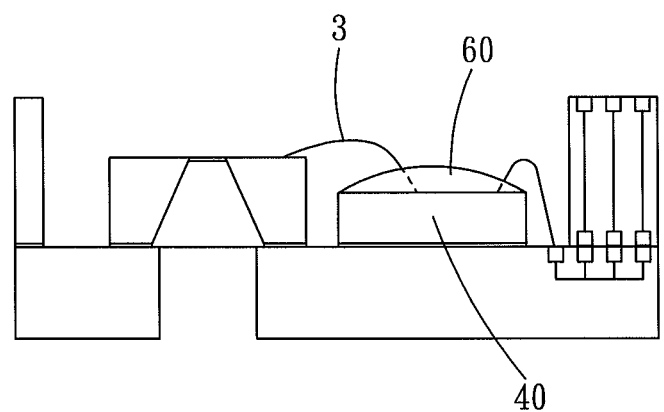

Step D: As illustrated in FIG. 1G, form an encapsulant 60 on one side of the processor chip 40 opposite to the substrate 20, and then employ a baking process to cure the encapsulant 50, thereby protecting the processor chip 40 and preventing each wire solder 3 from fracture.

Figure 1H:
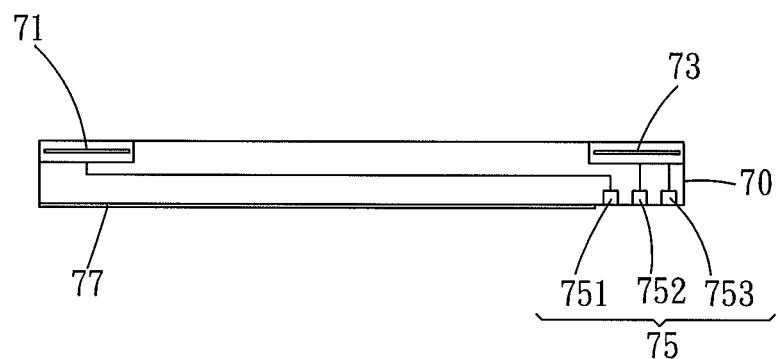
Figure 1I:
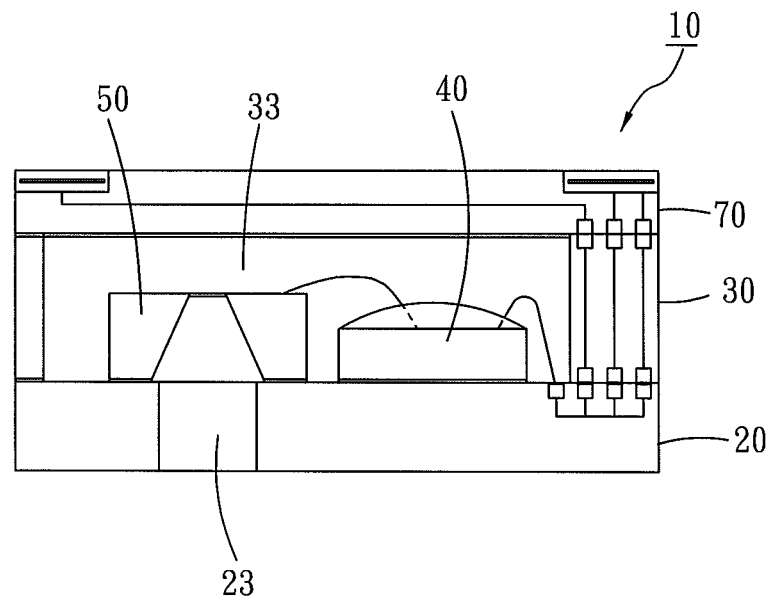
Figure 2:
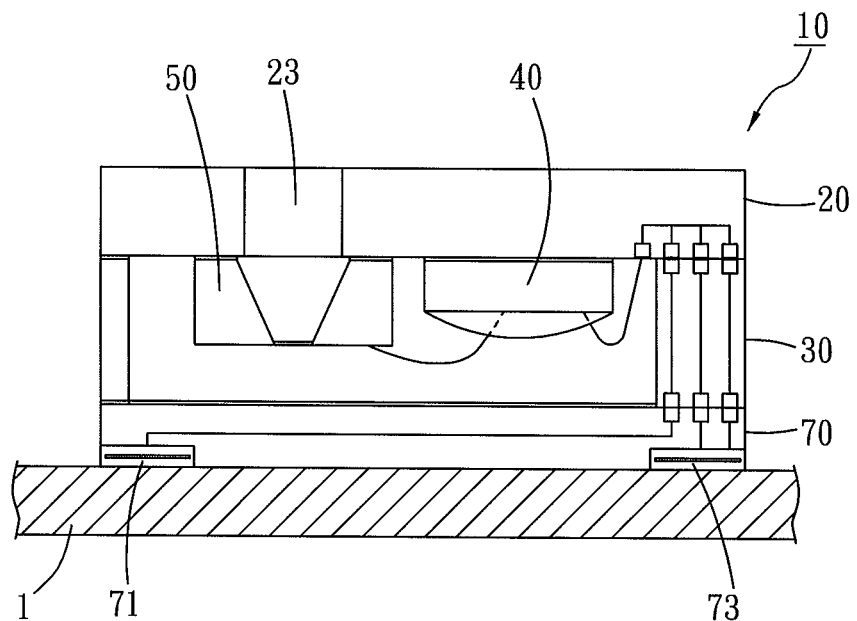
FIG. 2 is a schematic applied view illustrating a stacked MEMS microphone made according to the present invention and installed in a circuit board.

Step E: as illustrated in FIGS. 1H through 1I, provide a carrier board 70 comprises a first solder pad 71, a second solder pad 73, and a connection part 75 that comprises a first leading point 751, a second leading point 752 and a third leading point 753 respectively set apart from one another, and then fixedly mount the carrier board 70 at a top side of the retaining wall 30 to cover the processor chip 40 and the sensor chip 50, enabling the connection part 75 of the carrier board 70 be electrically coupled to the conducting circuit 31 of the retaining wall 30. In electrical connection, the conducting circuit 31 is disposed between the second solder pad 73 of the carrier board 70 and the conducting part 21 of the substrate 20. The processor chip 40 is electrically coupled to the first contact 211; the first lead wire 311 has two opposite ends thereof respectively electrically connected to the second contact 212 and the first leading point 751; the second lead wire 312 has two opposite ends thereof respectively electrically connected to the third contact 213 and the second leading point 752; the third lead wire 313 has two opposite ends thereof respectively electrically connected to the fourth contact 214 and the third leading point 753; the first leading point 751 is electrically connected to the first solder pad 71; the second leading point 752 and the third leading point 753 are respectively electrically connected to the second solder pad 73. More particularly, in order to have the substrate 20, the carrier board 70 and the retaining wall 30 be firmly secured together to provide excellent electromagnetic interference shielding effects, a sub step is added to each of Step A, Step B and Step E. This sub step is to form a first conductive layer 29 on the substrate 20 located at the same side relative to the conducting part 21, and a second conductive layer 35 on the retaining wall 30 at the side that is connected with the substrate 20. However, the first conductive layer 29 or second conductive layer 35 can be eliminated if one of the first conductive layer 29 and the second conductive layer 35 is sufficient to achieve stable connection between the substrate 20 and the retaining wall 63 and to provide excellent electromagnetic interference shielding effects. At final, form a third conductive layer 77 on the carrier board 70 at the side that is connected with the retaining wall 30. In the present preferred embodiment, each conductive layer 29,35,77 is formed using a screen printing or plate printing technique. Further, in order to improve the efficacy of the present packaging method, an automatic machine (not shown) or manual tool (not shown) can be used to perform a compression heating process in curing the conductive layer 29,35,77, so that the carrier board 70 and retaining wall 30 and the retaining wall 30 and the substrate 20 can be respectively firmly secured together to provide excellent electromagnetic interference shielding effects. Further, in the present preferred embodiment, as illustrated in FIG. 2, the MEMS microphone 10 is mounted on a circuit board 1 in an upside-down manner, i.e., the first solder pad 71 and second solder pad 73 of the carrier board 70 are located at the circuit board 1. By means of a reflow process, the first solder pad 71 and second solder pad 73 of the carrier board 70 are electrically coupled with the circuit board 1.

It's worth mentioning that in the preferred embodiment of the present invention, in order to reduce the manufacturing complexity and costs, an adhesive layer 27 can be formed on the substrate 20 prior to Step C, thereafter, mount the processor chip 40 and the sensor chip 50 on the adhesive layer 27 individually or simultaneously in the same manner as described in Step B. This step is determined subject to the capabilities of the equipment. Thereafter, employ a baking process to cure the adhesive layer 27, affixing the processor chip 40 and the sensor chip 50 to the substrate 20.

In conclusion, the stacked MEMS microphone 10 packaging method of the invention enables the processor chip 40 and the sensor chip 50 to be arranged on the substrate 20, which has the aforesaid through hole 23, to form a flip architecture MEMS microphone 10. Through the conducting part 21, the preparation of the connection part and the conducting circuit greatly reduces the steps of the packaging process, thereby reducing the degree of difficulty of the manufacturing process and the manufacturing costs.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A stacked MEMS microphone packaging method, comprising the steps of:
   A) providing a substrate comprising a conducting part and a through hole;
   B) providing a retaining wall comprising a conducting circuit and fixedly mounting the retaining wall at the substrate to have the conducting circuit be electrically coupled to the conducting part;
   C) mounting a processor chip on the substrate and electrically connecting the processor chip to the conducting part;
   D) mounting a sensor chip on the substrate over the through hole and adjacent to the processor chip and electrically connecting the sensor chip to the processor chip;
   E) providing a carrier board having a first solder pad and a second solder pad and fixedly mounting the carrier board at the retaining wall to cover the processor chip and the sensor chip and to have the conducting circuit be disposed between the conducting part and one of the first solder pad and second solder pad and electrically coupled to the conducting part, the first solder pad and the second solder pad; and
   F) forming a connection part on said carrier board and electrically coupling said connection part to said conducting circuit, said first solder pad and said second solder pad,
   wherein said conducting cart comprises a first contact, a second contact, a third contact and a fourth contact; said conducting circuit comprises a first lead wire, a second lead wire and a third lead wire; said connection part comprises a first leading point, a second leading point and a third leading point; said processor chip is electrically connected to said first contact; said first lead wire has two opposite ends thereof respectively electrically coupled to said second contact and said first leading point; said second lead wire has two opposite ends thereof respectively electrically coupled to said third contact and said second leading point; said third lead wire has two opposite ends thereof respectively electrically coupled to said fourth contact and said third leading point; said first leading point is electrically connected to said first solder pad; said second leading point and said third leading point are respectively electrically connected to said second solder pad.

2. The stacked MEMS microphone packaging method as claimed in claim 1, wherein said retaining wall extends around the border of said carrier board and defined with said carrier board an accommodation chamber for accommodating said processor chip and said sensor chip.

3. The stacked MEMS microphone packaging method as claimed in claim 1, further comprising a step of forming a first conductive layer on said substrate at the side that is connected with said retaining wall.

4. The stacked MEMS microphone packaging method as claimed in claim 3, further comprising a step of forming a second conductive layer on the retaining wall at the side that is connected with said substrate.

5. The stacked MEMS microphone packaging method as claimed in claim 4, further comprising a step of forming a third conductive layer on said carrier board at the side that is connected with said retaining wall.

6. The stacked MEMS microphone packaging method as claimed in claim 5, wherein each of said first conductive layer, said second conductive layer and said third conductive layer is formed using one of screen printing and plate printing techniques.

7. The stacked MEMS microphone packaging method as claimed in claim 5, further comprising a step of employing a compression heating process to cure each of said first conductive layer, said second conductive layer and said third conductive layer to have said carrier board and said retaining wall, said retaining wall and said substrate be respectively fixedly bonded together.

8. The stacked MEMS microphone packaging method as claimed in claim 1, further comprising a step of employing a wire bonding process to electrically connect said processor chip and said first contact.

9. The stacked MEMS microphone packaging method as claimed in claim 1, further comprising a step of employing a wire bonding process to electrically connect said sensor chip and said processor chip.

10. The stacked MEMS microphone packaging method as claimed in claim 1, further comprising a sub step of forming adhesive layer on said substrate, and then mounting said processor chip on said adhesive layer, and then employing a baking process to cure said adhesive layer and to bond said processor chip to said substrate.

11. The stacked MEMS microphone packaging method as claimed in claim 1, wherein the step of mounting the sensor chip further comprises a sub step of forming an adhesive layer on said substrate, and then mounting said sensor chip on said adhesive layer, and then employing a baking process to cure said adhesive layer and to have said sensor chip be bonded to said substrate.

12. The stacked MEMS microphone packaging method as claimed in claim 1, wherein the steps of mounting the processor chip and mounting the sensor chip further comprises a sub step of forming an adhesive layer on said substrate, and then mounting said processor chip and said sensor chip on said adhesive layer, and then employing a baking process to cure said adhesive layer and to have said processor chip and said sensor chip be bonded to said substrate.

13. The stacked MEMS microphone packaging method as claimed in claim 1, wherein the step of mounting the processor chip further comprises a sub step of forming an encapsulant on one side of said processor chip opposite to said substrate and then employing a baking process to cure said encapsulant.

14. The stacked MEMS microphone packaging method as claimed in claim 1, wherein said sensor chip is a microelectromechanical system.

15. The stacked MEMS microphone packaging method as claimed in claim 1, wherein said processor chip is an application-specific integrated circuit.

16. The stacked MEMS microphone packaging method as claimed in claim 1, wherein said carrier board, said retaining wall and said substrate are bonded together using an automatic lamination press.

17. The stacked MEMS microphone packaging method as claimed in claim 1, wherein said carrier board, said retaining wall and said substrate are bonded together using a manual lamination tool.

\* \* \* \* \*